United States Patent
Yamashita

(10) Patent No.: US 7,518,454 B2
(45) Date of Patent: Apr. 14, 2009

(54) OPERATIONAL AMPLIFIER SELECTING ONE OF INPUTS, AND AN AMPLIFYING APPARATUS USING THE OP AMPLIFIER THE VERIFICATION METHOD

(75) Inventor: Katsuya Yamashita, Tokyo (JP)

(73) Assignee: Verigy (Singapore) Pte. Ltd., Singapore (SG)

( * ) Notice: Subject to any disclaimer, the term of this patent is extended or adjusted under 35 U.S.C. 154(b) by 71 days.

(21) Appl. No.: 10/579,578

(22) PCT Filed: Nov. 16, 2004

(86) PCT No.: PCT/US2004/038269

§ 371 (c)(1),
(2), (4) Date: Mar. 27, 2007

(87) PCT Pub. No.: WO2005/053150

PCT Pub. Date: Jun. 9, 2005

(65) Prior Publication Data

US 2008/0224772 A1    Sep. 18, 2008

(30) Foreign Application Priority Data

Nov. 19, 2003    (JP)    ............... 2003-389346

(51) Int. Cl.
*H03F 3/45*    (2006.01)
(52) U.S. Cl. ............ 330/255; 330/75; 330/147
(58) Field of Classification Search .......... 330/69, 330/75, 147, 262, 263, 265, 267
See application file for complete search history.

(56) References Cited

U.S. PATENT DOCUMENTS

| 6,262,633 | B1 | 7/2001 | Close | 330/267 |
| 6,433,635 | B2 | 8/2002 | Watanabe | 330/253 |
| 6,489,845 | B1 * | 12/2002 | Maschhoff | 330/147 |
| 7,307,477 | B2 * | 12/2007 | Carreto et al. | 330/261 |

* cited by examiner

*Primary Examiner*—Khanh V Nguyen
(74) *Attorney, Agent, or Firm*—Holland & Hart, LLP

(57) ABSTRACT

A current feedback-type operational amplifier comprising multiple input parts and one output part, wherein each of the multiple input parts comprises a first input terminal, a second input terminal, and an output terminal, the signals input from the first input terminal are buffer amplified and output to the second input terminal, and current is output to the output terminal in an amount corresponding to the current that flows to the second input terminal; the output terminal part comprises an input terminal and an output terminal, signals obtained by adding in terms of current the signals of all of the input parts are input to the input terminal, and the signals input to the input terminal are converted to voltage signals, amplified, and output to the output terminal; and one of the above-mentioned input parts is made effective and the other input parts are made ineffective in response to first external signals, the impedance of the first input terminal, the second input terminal, and the output terminal of the above-mentioned ineffective input parts becomes high and the output current from the above-mentioned output terminal becomes zero.

7 Claims, 5 Drawing Sheets

OPERATIONAL AMPLIFIER SELECTING ONE OF INPUTS, AND AN AMPLIFYING APPARATUS USING THE OP AMPLIFIER THE VERIFICATION METHOD

FIELD OF THE INVENTION

The present invention relates to a current feedback-type operational amplifier having an input-switching function. The operational amplifier of the present invention is ideal for input-switching amplifying apparatuses, variable-gain amplifying apparatuses, and other amplifying apparatuses.

DISCUSSION OF THE BACKGROUND ART

Apparatuses that amplify by selecting one out of multiple signals have traditionally been constituted by combining switches for selecting the signal path with amplifiers for amplifying the signals (for instance, refer to JP (Kokai) 5[1993]-276,045 (page 4, FIG. 1).

The above-mentioned types of apparatuses use a reed relay or other mechanical switch in order to switch signals of a wide band region while controlling distortion. For instance, semiconductor testers that are used to test ICs comprise multiple mechanical switches and operational amplifiers in order to measure multiple signals which are output from an IC with few measurement resources. The number of pins in an IC or device under test increases each year and the band of the signals output from an IC becomes wider each year. Therefore, semiconductor testers must comprise more mechanical switches and operational amplifiers. However, mechanical switches consume a large amount of electricity and have a larger mounting surface area than other individual components and ICs (integrated circuits). Semiconductor testers have a limited housing size and electrical power; therefore, they cannot comprise this many mechanical switches and operational amplifiers. Moreover, semiconductor testers are required to measure signals output from an IC without distortion and they therefore cannot use semiconductor switches for switching signals.

Thus, an object of the present invention is to provide a current feedback-type operational amplifier having a function for amplification by selecting one signal out of multiple input signals.

SUMMARY OF THE INVENTION

The present invention is a current feedback-type operational amplifier comprising multiple input parts and one output part, characterized in that each of the multiple input parts comprises a first input terminal, a second input terminal, and an output terminal, the signals input from the first input terminal are buffer amplified and output to the second input terminal, and current is output to the output terminal in an amount corresponding to the current that flows to the second input terminal; the output terminal part comprises an input terminal and an output terminal, signals obtained by adding the signals of all of the input parts by current are input to the input terminal, and the signals input to the input terminal are converted to voltage signals, amplified, and output to the output terminal; and one of the above-mentioned input parts is made effective and the others of the input parts are made ineffective in response to the first external signals; the impedance of the first input terminal, the second input terminal, and the output terminal of the above-mentioned ineffective input parts becomes high and the output current from the output terminal becomes zero, and only the signals input to the above-mentioned effective input part are thereby amplified.

The current feedback-type operational amplifier of the present invention, further characterized in that all of the above-mentioned input parts as well as the above-mentioned output part are made ineffective in response to second external signals; this results in the impedance of the first input terminal and the second input terminal of the above-mentioned ineffective input parts becoming high and the output current from the above-mentioned output terminal becoming zero; and the impedance of the output terminal of the above-mentioned output part becomes high.

The current feedback-type operational amplifier, further characterized in that each of the above-mentioned input parts outputs current to the above-mentioned output terminal in the same amount as the current flowing to the above-mentioned second input terminal.

The current feedback-type operational amplifier, further characterized in that each of the above-mentioned input parts comprises a voltage buffer that regards the above-mentioned first input terminal as the input terminal and the above-mentioned second input terminal as the output terminal, as well as a current mirror circuit connected to the voltage buffer.

The present invention also pertains to a signal-switching amplifying apparatus, characterized in that it comprises the current feedback-type operational amplifier discussed immediately above.

The present invention also pertains to a variable-gain amplifying apparatus, characterized in that it comprises the current feedback-type operational amplifier discussed above.

The present invention also pertains to a variable-band amplifying apparatus, characterized in that it comprises the current feedback-type operational of the present invention.

DETAILED DESCRIPTION OF THE PREFERRED EMBODIMENT

The amplifying apparatus of the present invention that has a function for switching input signals that does not require mechanical switches; therefore, power consumption, mounting surface area, and cost are reduced. Moreover, this amplifying apparatus is capable of virtually the same distortion-free amplification of wide-band signals as with the prior art.

Figure 1:
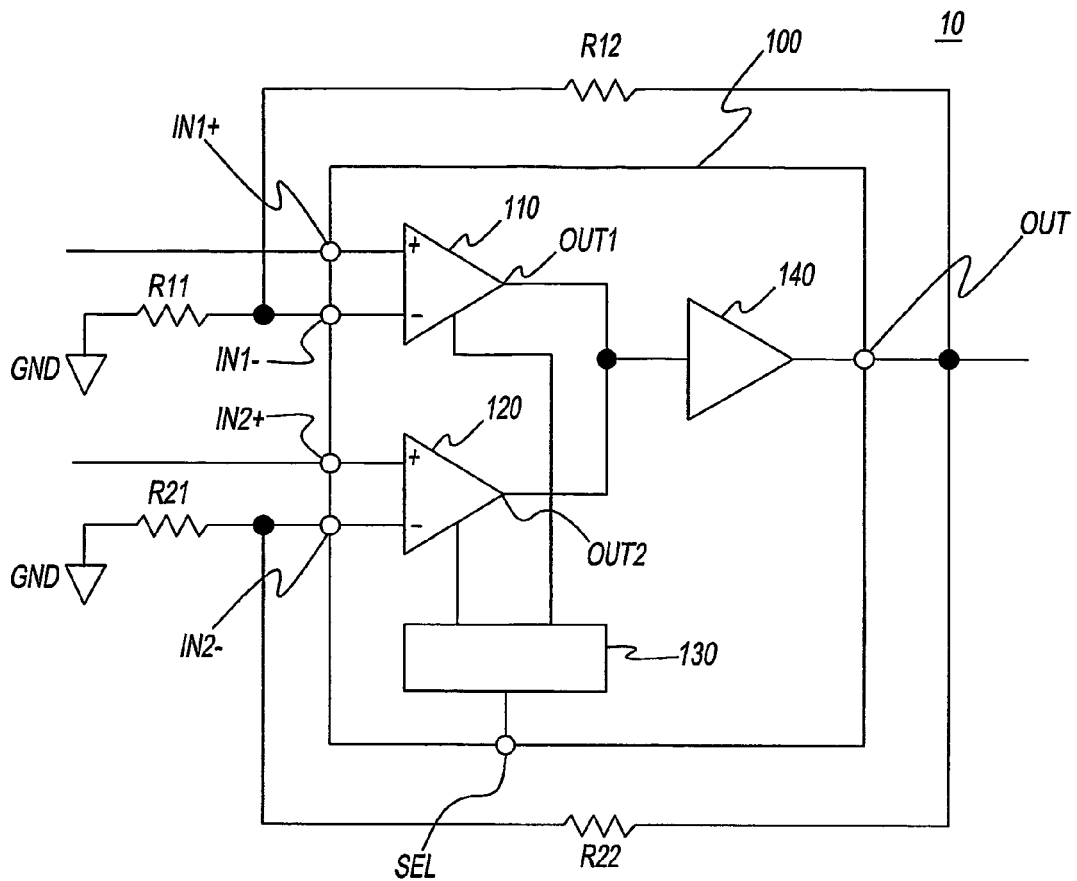
FIG. 1 is a drawing showing signal-switching amplifying apparatus 10 of the first embodiment of the present invention.

The present invention will now be described in detail based on the embodiments in the attached drawings. The first embodiment of the present invention is a signal-switching amplifying apparatus, and a block diagram thereof is shown in FIG. 1. A signal-switching amplifying apparatus 10 comprises an operational amplifier 100. Operational amplifier 100 comprises an input part 110, an input part 120, a selector 130, and an output part 140.

Figure 2:
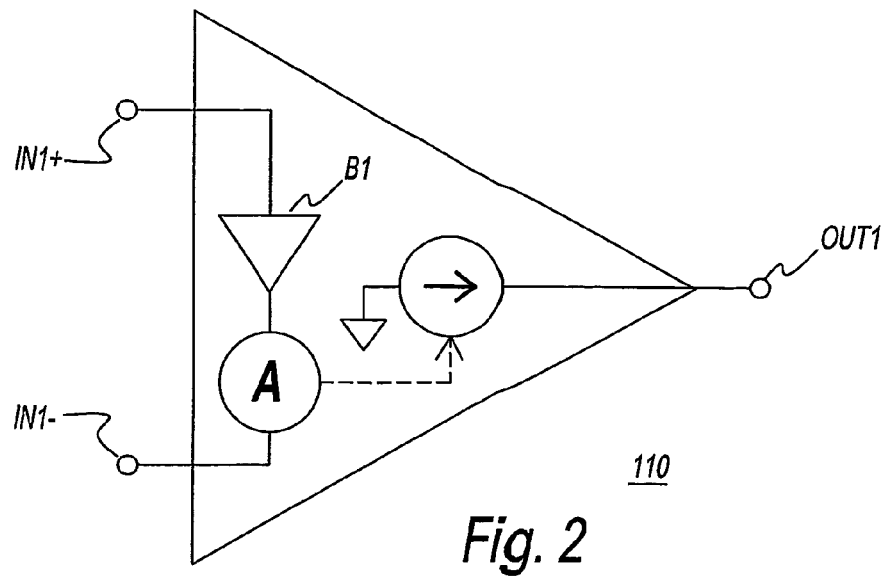
FIG. 2 is a block diagram showing operational amplifier 100.

Input part 110 has a non-inverted input terminal IN1+, an inverted input terminal IN1−, and an output terminal OUT1. The inside block of input terminal 110 is shown in FIG. 2. Input part 110 in FIG. 2 comprises a buffer B1 between the non-inverted input terminal IN1+ and the inverted input terminal IN1−. Buffer B1 is a voltage buffer. Therefore, voltage signals input from non-inverted input terminal IN1+ are buffer amplified to the same amplification and output to inverted input terminal IN1−. Buffer amplification is also called buffering. Moreover, input part 110 outputs current from output terminal OUT1 in the same amount as the current that flows to inverted input terminal IN1−. Refer to FIG. 1 once again. Input part 110 becomes enabled (effective) or disabled (ineffective) in response to signals input from the outside. The input impedance of inverted input terminal IN1− of enabled input part 110 is low, and the input impedance of non-inverted input terminal IN1+ and the output impedance of output terminal OUT1 are high. Moreover, the current output from output terminal OUT1 of disabled input part 110 becomes zero. The input impedance of non-inverted input terminal IN1+ and inverted input terminal IN1−, as well as the output terminal OUT1, are all high at this time. The leakage of undesired signals from the inverted input terminal IN1− is prevented at this time.

Input part 120 has a non-inverted input terminal IN2+, an inverted input terminal IN2−, and an output terminal OUT2. Input terminal 120 has the same inside structure as input part 110 shown in FIG. 2. That is, input part 120 comprises a buffer B2 between the non-inverted input terminal IN2+ and the inverted input terminal IN2−. Buffer B2 is a voltage buffer. Therefore, voltage signals input from non-inverted input terminal IN2+ are buffer amplified to the same amplification and output to inverted input terminal IN2−. Moreover, input part 120 outputs current from output terminal OUT2 in the same amount as the current that flows to inverted input terminal IN2−. Input part 120 becomes enabled (effective) or disabled (ineffective) in response to signals input from the outside. The input impedance of inverted input terminal IN2− of enabled input part 120 is low, and the input impedance of non-inverted the input terminal IN12+ and the output impedance of output terminal OUT2 are high. Moreover, the current output from the output terminal OUT2 of disabled input part 120 becomes zero. The input impedance of the non-inverted input terminal IN2+ and the inverted input terminal IN2−, as well as the output terminal OUT2, are all high at this time. The leakage of undesired signals from the inverted input terminal IN2− is prevented at this time.

Selector 130 is connected to selected signal terminal SEL, input part 110, and input part 120 of operational amplifier 100. Selector 130 is a device that brings one of the multiple input parts connected to selector 130 to an enabled state and all of the other input parts to a disabled state in accordance with signals input from selected signal terminal SEL. Input part 120 is in a disabled state when input part 110 is in an enabled state. Moreover, input part 120 is in an enabled state when input part 110 is in a disabled state.

Output part 140 is an amplifier that converts the input current signals to voltage signals and further amplifies and outputs these voltage signals. Signals obtained by addition in terms of current of output current signals from input part 110 and output current signals from input part 120 are input to output part 140. The input impedance of output part 140 is always high. The high impedance generates high conversion gain.

The input terminals of operational amplifier 100 comprise non-inverted input terminal IN1+, inverted input terminal IN1−, non-inverted input terminal IN2+, and inverted input terminal IN2−. Moreover, the output terminals of operational amplifier 100 comprise output terminal OUT of output part 140.

Multiple resistors are connected so that operational amplifier 100 in FIG. 1 functions as a non-inverted amplifying apparatus. That is, a resistor R11 is connected between inverted input terminal IN1− and ground GND, and a resistor R12 is connected between inverted input terminal IN1− and output terminal OUT. Moreover, a resistor R21 is connected between inverted input terminal IN2− and ground GND and a resistor R22 is connected between inverted input terminal IN2− and output terminal OUT.

Operational amplifier 100 is structured and operates as described above; therefore, any one out of multiple signals can be selected and amplified. Moreover, although operational amplifier 100 has multiple input parts, only one input part is in an enabled state. Therefore, power consumption of operational amplifier 100 is virtually unchanged from the power consumption of conventional operational amplifiers having a pair of input terminals and one output terminal Furthermore, operational amplifier 100 can be structured as an integrated circuit; as a result, the mounting surface area is reduced and the manufacturing cost is low.

Consequently, signal-switching amplifying apparatus 10 that uses operational amplifier 100 does not require an outside relay and the mounting surface area and cost are therefore reduced in comparison to the prior art. Moreover, signal-switching amplifying apparatus 10 that uses amplifier 100 does not require electricity to drive a relay and therefore power consumption is reduced in comparison to the prior art. In addition, the output impedance of the disabled input part of signal-switching amplifying apparatus 10 is brought to a high value and resistors and other extra components are not connected between each input part and the output part; therefore, wide-band signals can be amplified without distortion.

It should be noted that input part 110 and input part 120 can have a structure such that current is output from the respective output terminals in an amount that corresponds to the current flowing to the respective inverted input terminal.

Figure 3:
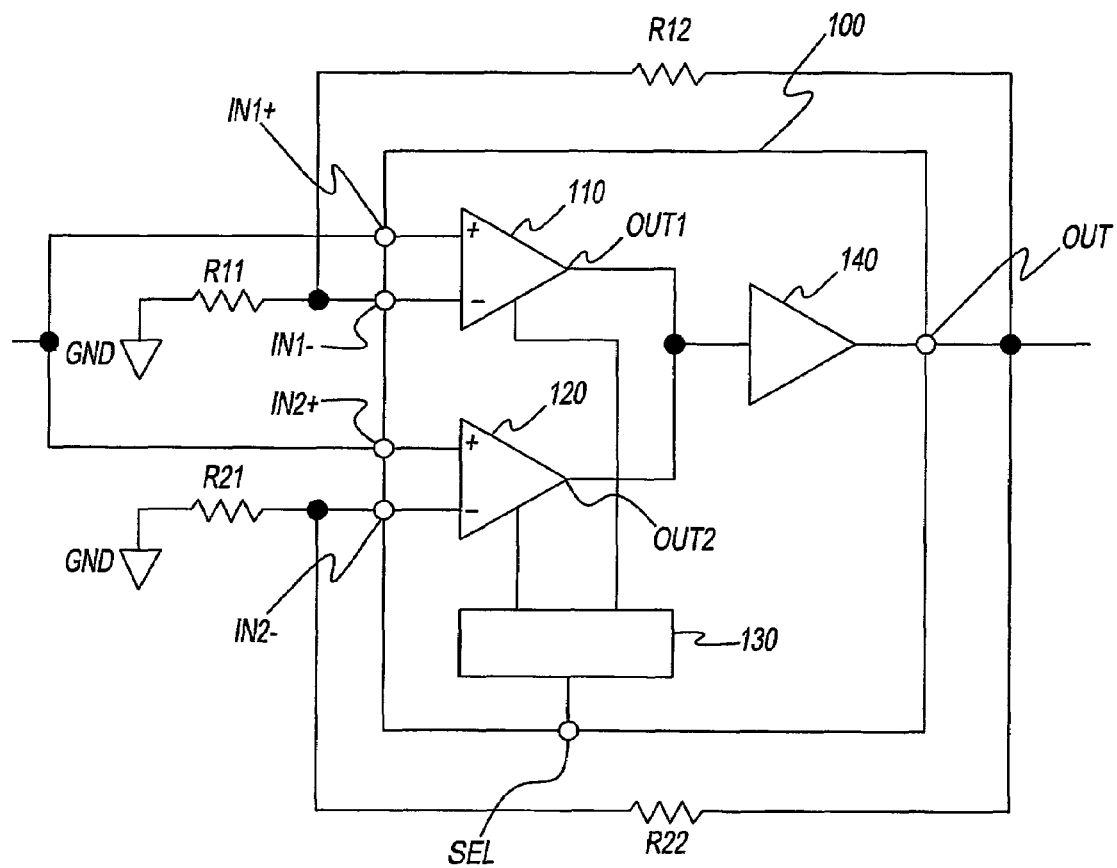
FIG. 3 is a diagram showing variable-gain amplifying apparatus 20 of the second embodiment of the present invention.

The second embodiment of the present invention is a variable-gain amplifying apparatus, and the block diagram thereof is shown in FIG. 3. A variable-gain amplifying apparatus is an amplifying apparatus with which gain (the amplification rate) can be varied. The same symbols are used in FIG. 3 for the structural components that are duplicated from FIG. 1 and a detailed description thereof is omitted. A variable-gain amplifying apparatus 20 shown in FIG. 3 differs from signal-switching amplifying apparatus 10 in FIG. 1 in that a non-inverted input terminal IN1+ and a non-inverted input terminal IN2+ are connected to form one input terminal. Moreover, the resistance ratio R12/R11 and the resistance ratio R22/R21 are set at different values.

Variable-gain amplifying apparatus 20 constructed as described above is capable of varying gain without using mechanical switches. Therefore, power consumption, mounting surface area, and cost are reduced. Moreover, this variable-gain amplifying apparatus 20 is capable of virtually the same distortion-free amplification of wide-band signals as with the prior art.

Figure 4:
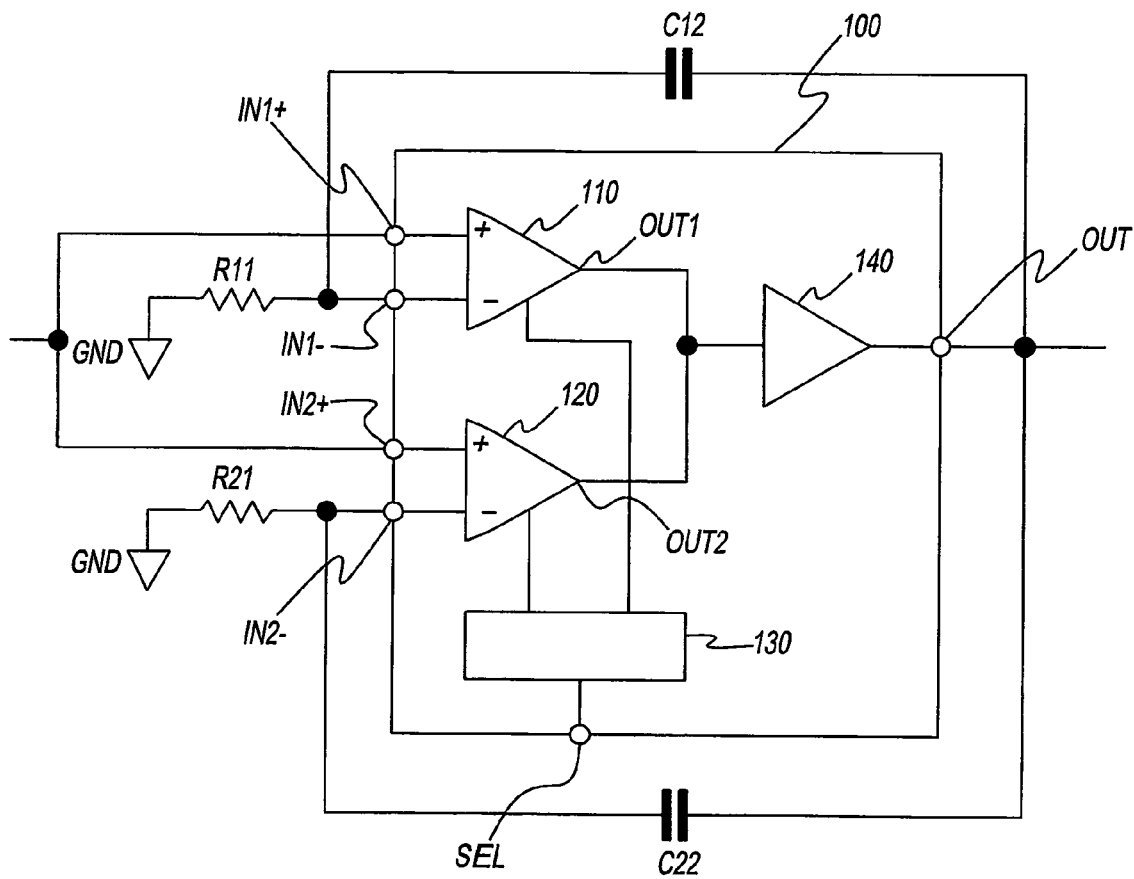
FIG. 4 is a diagram showing variable-band amplifying apparatus 30 of the third embodiment of the present invention.

A third embodiment is a variable-band amplifying apparatus, and a block diagram thereof is shown in FIG. 4. A variable-band amplifying apparatus is an amplifying apparatus with which the signal pass band can be varied. The same symbols are used in FIG. 4 for the structural components that are duplicated from FIG. 3 and a detailed description thereof is omitted. A variable-band amplifying apparatus 30 in FIG. 4 differs from variable-gain amplifying apparatus shown in FIG. 3 in that resistor R12 and resistor R22 are replaced by a capacitor C12 and a capacitor C22. Moreover, the time constant from R11 and C12 and the time constant from R21 and C22 are set at different values.

Variable-band amplifying apparatus 30 constructed as described above is capable of varying the signal pass band without using mechanical switches. Therefore, power consumption, mounting surface area, and cost are reduced. Moreover, this variable-band amplifying apparatus 30 is capable of virtually the same distortion-free amplification of wide-band signals as with the prior art. Furthermore, the components that are resistors R11 and R21 and capacitors C12 and C22 here can be resistors, capacitors, inductors, and other components. For instance, the variable-band amplifying apparatus shown in FIG. 4 operates as a low-pass filter, but it can be modified to operate as a high-pass filter.

Figure 5:
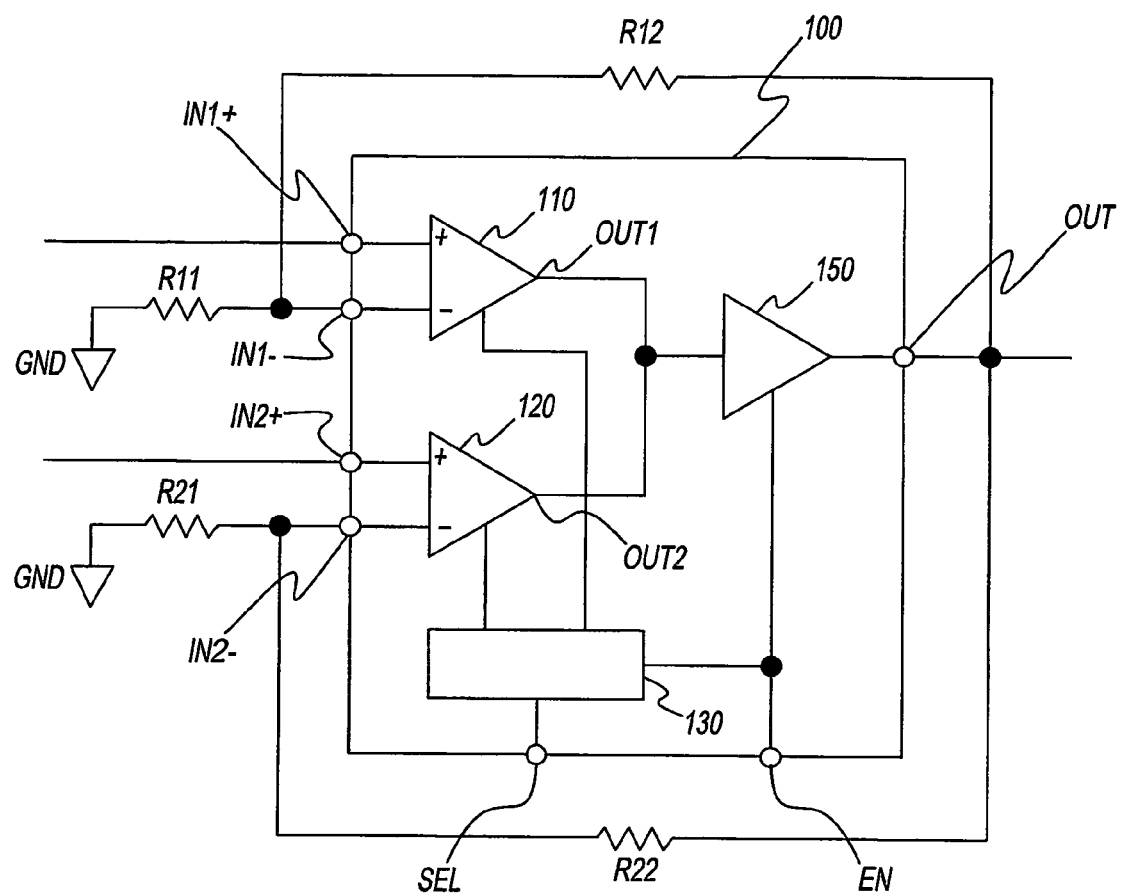
FIG. 5 is a diagram showing signal-switching amplifying apparatus 40 of the fourth embodiment of the present invention.

The fourth embodiment of the present invention is a signal-switching amplifying apparatus, and a block diagram thereof is shown in FIG. 5. The same symbols are used in FIG. 5 for the structural components that are duplicated from FIG. 1 and a detailed description thereof is omitted. A signal-switching amplifying apparatus 40 in FIG. 5 comprises an operational amplifier 200. Operational amplifier 200 differs from the operational amplifier 100 in FIG. 1 in that it has a function that disables all of the input terminals and the output terminal. Operational amplifier 200 comprises enable terminal EN. Enable terminal EN is connected between selector 130 and an output part 150. Operational amplifier 200 becomes enabled or disabled in response to signals input to enable terminal EN. Enabled operational amplifier 200 operates in the same way as operational amplifier 100. All input parts and the output part of disabled operational amplifier 200 are in a disabled state. The input impedance of all input parts of operational amplifier 200 and the output of the output terminal of the operational amplifier are high at this time.

When operational amplifier 200 constructed in this way is disabled, signals input to non-inverted input terminal IN1+ or IN2+ do not appear at output terminal OUT via resistor R12 or R22. For instance, when multiple operational amplifiers 200 to which a common output terminal OUT is connected are used, operational amplifiers 200 will not interfere with one another as long as the unnecessary operational amplifiers 200 are in a disabled state. Consequently, signal-switching amplifying apparatus 40 can comprise multiple operational amplifiers 200 in order to switch among more signals.

EXAMPLE 1

Figure 6:
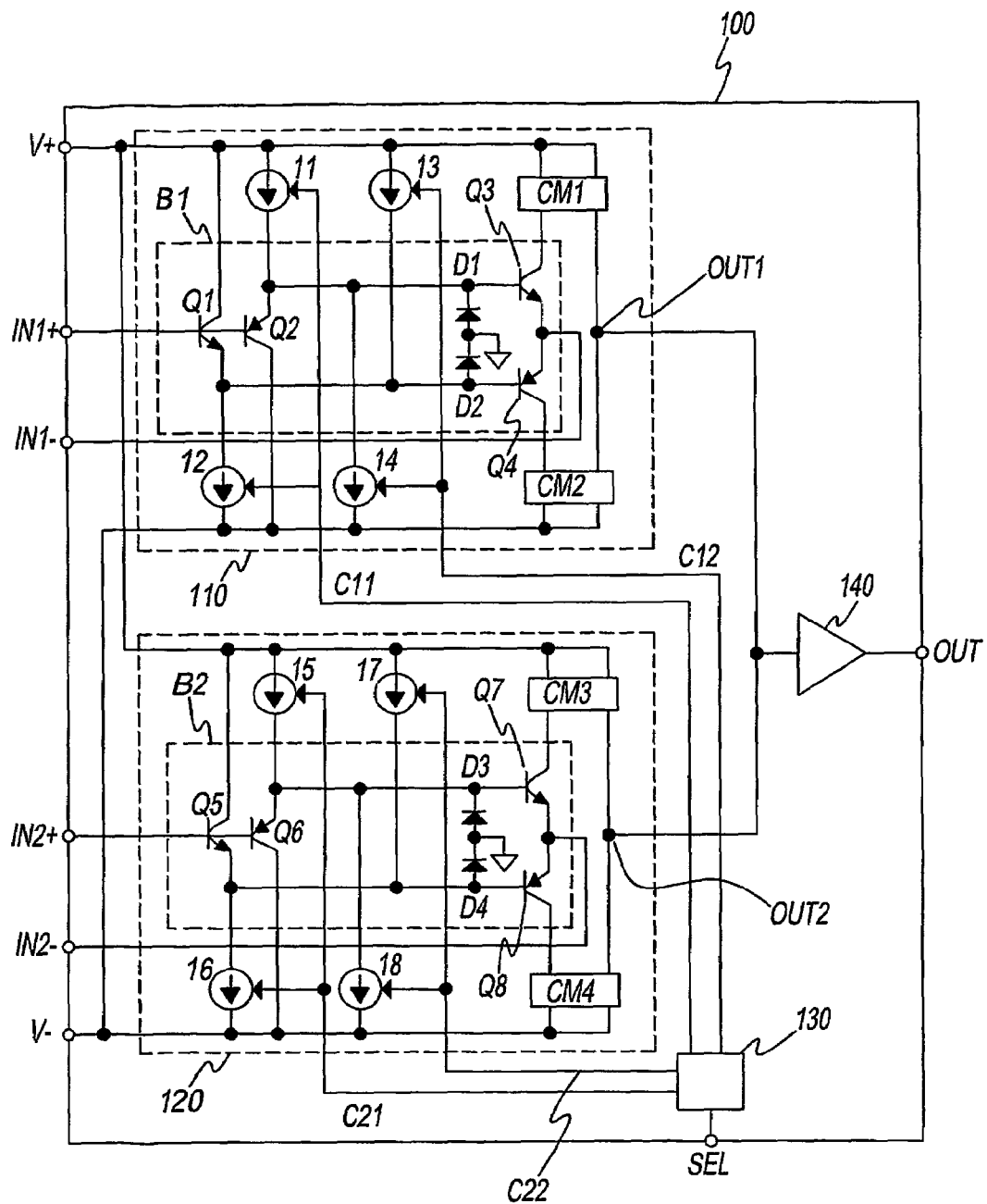
FIG. 6 is a diagram showing the inside circuit of operational amplifier 100.

An example of the inside circuit of above-mentioned operational amplifier 100 is shown in FIG. 6. As shown in FIG. 1, operational amplifier 100 comprises input parts 110 and 120, selector 130, and output part 140. FIG. 6 is referred to below.

Input part 110 comprises buffer B1 and current mirror circuits CM1 and CM2.

Buffer B1 comprises NPN transistors Q1 and Q3, as well as PNP transistors Q2 and Q4. Transistors Q1 and Q2 form the input step of buffer B1. Moreover, transistors Q3 and Q4 form the output step of buffer B1. The base of transistor Q1 is connected to non-inverted input terminal IN1+, the collector of the transistor is connected to a positive electrical source terminal V+, and the emitter of the transistor is connected to a negative power source terminal V− via a constant current source 11. The base of transistor Q2 is connected to non-inverted input terminal IN1+, the collector of the transistor is connected to positive power source terminal V+ via a constant current source 12, and the emitter of the transistor is connected to negative power source V−. The base of transistor Q3 is connected to the emitter of transistor Q2, the collector of the transistor is connected to current mirror circuit CM1, and the emitter is connected to inverted input terminal IN1−. The base of transistor Q4 is connected to the emitter of transistor Q1, the collector of the transistor is connected to current mirror circuit CM2, and the emitter of the transistor is connected to the inverted input terminal IN1−.

Current mirror circuit CM1 is connected to output terminal OUT1 and outputs current in the same amount as the collector current of transistor Q3. Current mirror circuit CM2 is connected to output terminal OUT1 and outputs current in the same amount as the collector current of transistor Q4. Consequently, the current output from output terminal OUT1 is equal to the current output from inverted input terminal IN−.

A constant current source 13 is connected between positive power source terminal V+ and the base of transistor Q4. A constant current source 14 is connected between negative power source terminal V− and the base of transistor Q3. A diode D1 is connected between the base and ground of transistor Q3. A diode D2 is connected between the base of transistor Q4 and ground. The anode of diode D1 and the cathode of diode D2 are grounded. Diodes D1 and D2 are employed for protecting the base-emitter junction of transistors Q3 and Q4 from reverse-bias voltage.

Input part 120 comprises buffer B2 and current mirror circuits CM3 and CM4.

Buffer B2 comprises NPN transistors Q5 and Q7, as well as PNP transistors Q6 and Q8. Transistors Q5 and Q6 form the input step of buffer B2. Moreover, transistors Q7 and Q8 form the output step of buffer B2. The base of transistor Q5 is connected to non-inverted input terminal IN2+, the collector of the transistor is connected to positive electrical source terminal V+, and the emitter of the transistor is connected to negative power source terminal V− via a constant current source 15. The base of transistor Q6 is connected to non-inverted input terminal IN2+, the collector of the transistor is connected to positive power source terminal V+ via a constant current source 16, and the emitter of the transistor is connected to negative power source V−. The base of transistor Q7 is connected to the emitter of transistor Q6, the collector of the transistor is connected to current mirror circuit CM3, and the emitter is connected to inverted input terminal IN2−. The base of transistor Q8 is connected to the emitter of transistor Q5, the collector of the transistor is connected to current mirror circuit CM4, and the emitter of the transistor is connected to the inverted input terminal IN2−.

Current mirror circuit CM3 is connected to output terminal OUT2 and outputs current in the same amount as the collector current of transistor Q7. Current mirror circuit CM4 is connected to output terminal OUT2 and outputs current in the same amount as the collector current of transistor Q8. Consequently, the current output from output terminal OUT2 is equal to the current output from inverted input terminal IN2−.

A constant current source 17 is connected between positive power source terminal V+ and the base of transistor Q8. A constant current source 18 is connected between negative power source terminal V− and the base of transistor Q7. A diode D3 is connected between the base and ground of transistor Q7. A diode D4 is connected between the base of transistor Q8 and ground. The anode of diode D3 and the cathode of diode D4 are grounded. Diodes D3 and D4 are employed for protecting the base-emitter junction of transistors Q7 and Q8 from reverse-bias voltage.

Buffers B1 and B2 are called two-step push-pull emitter followers or diamond buffers. The current from each constant current source I1 through I8 flows from positive power source terminal V+ to negative power source terminal V−. Moreover, constant current sources I1 through I8 are each controlled by external signals and are either on or off. The output current of constant current sources I1 through I8 becomes zero and the output impedance becomes high when the sources are off.

Output part 140 is an amplifier that converts the input current signals to voltage signals and further amplifies and outputs these voltage signals. Signals obtained by addition in terms of the current of output current signals from input part 110 and of output current signals from input part 120 are input to output part 140. The input impedance of output part 140 is always high. Therefore, the output current of input parts 110 and 120 is very small.

Selector 130 is connected to a selected signal terminal SEL, input part 110, and input part 120 of operational amplifier 100. Selector 130 is connected to constant current sources I1 and I2 via a signal line P11. Selector 130 is further connected to constant current sources I3 and I4 via a signal line P12. Selector 130 is further connected to constant current sources I5 and I6 via a signal line P21. Selector 130 is connected to constant current sources I7 and I8 via a signal line P22. Selector 130 turns each of constant current sources I1 through I8 on or off, brings one of the multiple input parts to an enabled state, and brings the other input parts to a disabled state in response to the signals input from selected signal terminal SEL.

When input part 110 is enabled, constant current sources I1 and I2 are on and constant current sources I3 and I4 are off. On the other hand, when input part 110 is disabled, constant current sources I1 and I2 are off and constant current sources I3 and I4 are on. Moreover, when input part 120 is enabled, constant current sources I5 and I6 are on and constant current sources I7 and I8 are off. On the other hand, when input part 120 is disabled, constant current sources I5 and I6 are off and constant current sources I7 and I8 are on.

Operational amplifiers 100 constructed as described above can be easily produced as an integrated circuit.

What is claimed is:

1. A current feedback-type operational amplifier comprising multiple input parts and one output part, wherein each of said multiple input parts comprises a first input terminal, a second input terminal, and first output terminal, wherein signals input from said first input terminal are buffer amplified and output to said second input terminal, and wherein current is output to the first output terminal in an amount corresponding to current that flows to said second input terminal;

said output part comprises a third input terminal and a second output terminal, wherein signals obtained by adding in terms of current the signals of all of said multiple input parts are input to said third input terminal, and wherein signals input to said third input terminal are converted to voltage signals, amplified, and output to the second output terminal as an output signal; and one of said multiple input parts is enabled and the other of said multiple input parts are disabled in response to a first external signal, wherein the impedance of said first input terminal, said second input terminal, and said first output terminal of said disabled input parts becomes high and the output current from said first output terminal becomes zero, and only the signals input to said enabled input parts are thereby amplified.

2. The current feedback-type operational amplifier as described in claim 1, wherein all of said multiple input parts and said output part are disabled in response to second external signals; this results in the impedance of said first input terminal and said second input terminal of said disabled input parts becoming high and output current from said output terminal becoming zero; and the impedance of said output terminal of said output part becomes high.

3. The current feedback-type operational amplifier according to claim 1, wherein each of said input parts outputs current to said first output terminal in the same amount as the current flowing to said second input terminal.

4. The current feedback-type operational amplifier according to claim 1, wherein each of said input parts comprises a voltage buffer that regards said first input terminal as its input terminal and said second input terminal as its output terminal, and a current mirror circuit connected to said voltage buffer.

5. A signal-switching amplifying apparatus comprising a current feedback-type operational amplifier comprising multiple input parts and one output part, wherein each of said multiple input parts comprises a first input terminal, a second input terminal, and first output terminal, wherein signals input from said first input terminal are buffer amplified and output to said second input terminal, and wherein current is output to the first output terminal in an amount corresponding to current that flows to said second input terminal;

said output part comprises a third input terminal and a second output terminal, wherein signals obtained by adding in terms of current the signals of all of said multiple input parts are input to said third input terminal, and wherein signals input to said third input terminal are converted to voltage signals, amplified, and output to the second output terminal as an output signal; and one of said multiple input parts is enabled and the other of said multiple input parts are disabled in response to a first external signal, wherein the impedance of said first input terminal, said second input terminal, and said first output terminal of said disabled input parts becomes high and the output current from said first output terminal becomes zero, and only the signals input to said enabled input parts are thereby amplified.

6. A variable-gain amplifying apparatus which comprises a current feedback-type operational amplifier comprising multiple input parts and one output part, wherein each of said multiple input parts comprises a first input terminal, a second input terminal, and first output terminal, wherein signals input from said first input terminal are buffer amplified and output to said second input terminal, and wherein current is output to the first output terminal in an amount corresponding to current that flows to said second input terminal;

said output part comprises a third input terminal and a second output terminal, wherein signals obtained by adding in terms of current the signals of all of said multiple input parts are input to said third input terminal, and wherein signals input to said third input terminal are converted to voltage signals, amplified, and output to the second output terminal as an output signal; and one of said multiple input parts is enabled and the other of said multiple input parts are disabled in response to a first external signal, wherein the impedance of said first input terminal, said second input terminal, and said first output terminal of said disabled input parts becomes high and the output current from said first output terminal becomes zero, and only the signals input to said enabled input parts are thereby amplified.

7. A variable-band amplifying apparatus which comprises a current feedback-type operational amplifier comprising multiple input parts and one output part, wherein each of said multiple input parts comprises a first input terminal, a second input terminal, and first output terminal, wherein signals input from said first input terminal are buffer amplified and output to said second input terminal, and wherein current is output to the first output terminal in an amount corresponding to current that flows to said second input terminal;

said output part comprises a third input terminal and a second output terminal, wherein signals obtained by adding in terms of current the signals of all of said multiple input parts are input to said third input terminal, and wherein signals input to said third input terminal are converted to voltage signals, amplified, and output to the second output terminal as an output signal; and one of said multiple input parts is enabled and the other of said multiple input parts are disabled in response to a first external signal, wherein the impedance of said first input terminal, said second input terminal, and said first output terminal of said disabled input parts becomes high and the output current from said first output terminal becomes zero, and only the signals input to said enabled input parts are thereby amplified.

* * * * *